US005563598A

United States Patent [19]
Hickling

[11] Patent Number: 5,563,598
[45] Date of Patent: Oct. 8, 1996

[54] DIFFERENTIAL COMPARATOR CIRUCIT

[75] Inventor: Ronald M. Hickling, Simi Valley, Calif.

[73] Assignee: Technoconcepts, Inc., Newbury Park, Calif.

[21] Appl. No.: 322,986

[22] Filed: Oct. 14, 1994

[51] Int. Cl.$^6$ ................................................ H03M 1/12
[52] U.S. Cl. ............................................................ 341/155
[58] Field of Search ...................................... 341/161, 155, 341/156, 159, 172

[56] References Cited

U.S. PATENT DOCUMENTS

5,194,866  3/1993  Imaizumi et al. ...................... 341/156
5,402,128  3/1995  Kusumoto et al. .................... 341/172

*Primary Examiner*—Brian K. Young
*Attorney, Agent, or Firm*—Poms, Smith, Lande, & Rose

[57] ABSTRACT

A differential comparator circuit for an Analog-to-Digital Converter (ADC) or other application includes a plurality of differential comparators and a plurality of offset voltage generators. Each comparator includes first and second differentially connected transistor pairs having equal and opposite voltage offsets. First and second offset control transistors are connected in series with the transistor pairs respectively. The offset voltage generators generate offset voltages corresponding to reference voltages which are compared with a differential input voltage by the comparators. Each offset voltage is applied to the offset control transistors of at least one comparator to set the overall voltage offset of the comparator to a value corresponding to the respective reference voltage. The number of offset voltage generators required in an ADC application can be reduced by a factor of approximately two by applying the offset voltage from each offset voltage generator to two comparators with opposite logical sense such that positive and negative offset voltages are produced by each offset voltage generator.

19 Claims, 7 Drawing Sheets

DIFFERENTIAL COMPARATOR CIRUCIT

This invention was made with Government support under Small Business Innovative Research Grant No. DE-FG03-92ER81459, awarded by the Department of Energy. The Government has certain rights in this invention.

BACKGROUND OF THE INVENTION

1. Field of the Invention

The present invention generally relates to the art of electronic circuitry, and more specifically to a thresholdless differential comparator circuit for an Analog-to-Digital Converter (ADC) or other application.

2. Description of the Related Art

Figures 1, 5, 6:
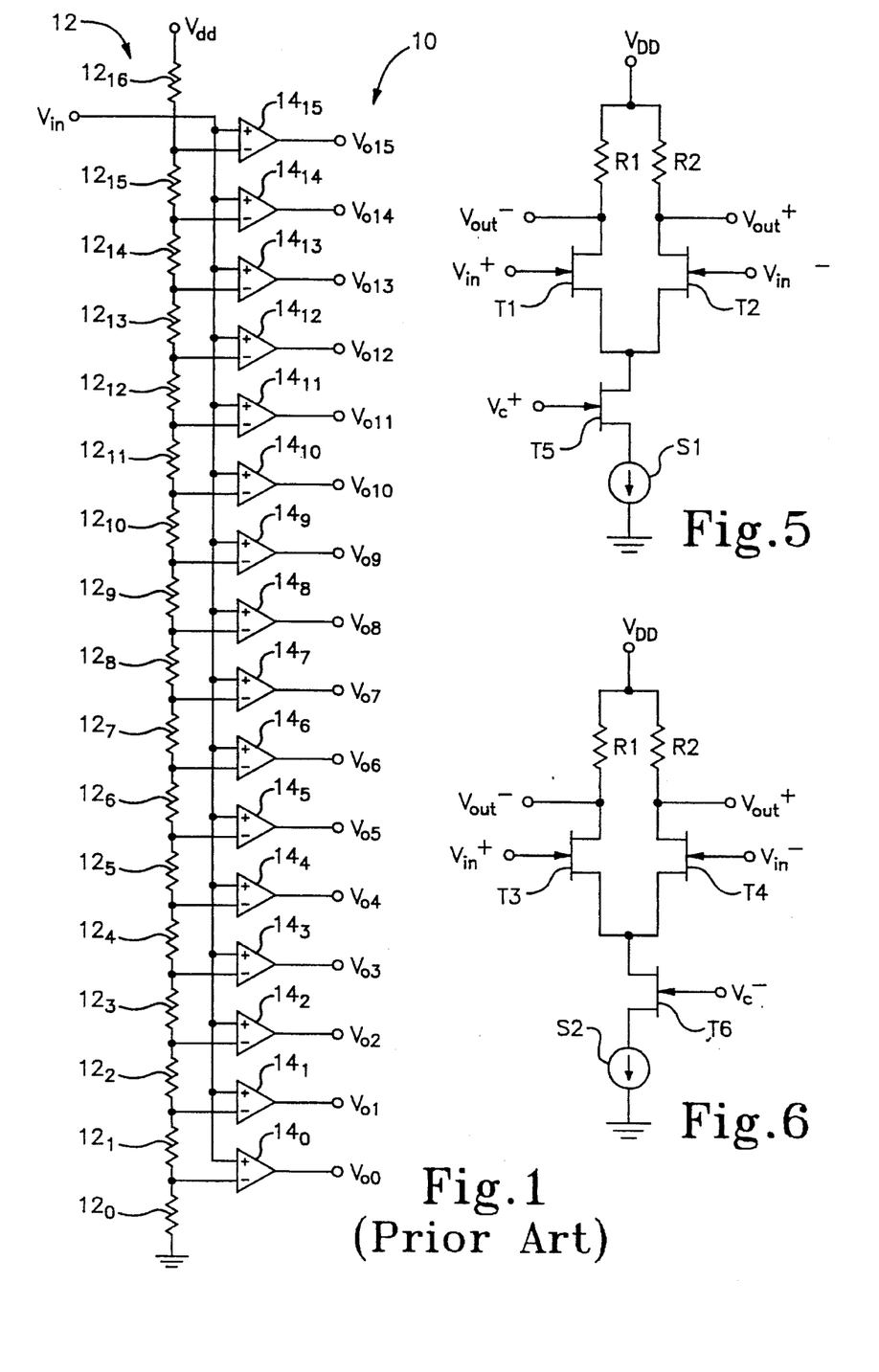
FIG. 1 is an electrical schematic diagram illustrating a prior art comparator circuit for an Analog-to-Digital Converter (ADC)
FIGS. 5 and 6 are electrical schematic diagrams illustrating the operation of the comparator of FIG. 2.

A conventional Analog-to-Digital Converter (ADC) generally comprises a bank of single-ended voltage comparators as illustrated in FIG. 1. The reference numeral 10 designates a 4-bit (16 discrete value) comparator circuit comprising a voltage divider 12 including a plurality of resistors $12_0$ to $12_{16}$ that are connected in series between a positive voltage supply $V_{DD}$ and ground. The voltages at the upper ends of the resistors $12_0$ to $12_{16}$ increase progressively from the bottom to the top of the voltage divider 12.

The circuit further comprises a plurality of single-ended voltage comparators $14_0$ to $14_{15}$ having inverting inputs connected to the upper ends of the resistors $12_0$ to $12_{15}$ respectively. An analog input voltage $V_{in}$ is applied to the non-inverting inputs of the comparators $14_0$ to $14_{15}$, which produce output voltages $V_{o1}$ to $V_{o15}$ at their single-ended outputs.

An N-bit ADC requires $2^N$ resistors and $2^N-1$ comparators. Thus, the circuit 10 comprises, for a 4-bit converter, 16 resistors and 15 comparators. In operation, each comparator $14_0$ to $14_{15}$ produces a logically high output if the input voltage $V_{in}$ is higher than the voltage at its inverting input, and vice-versa.

The values of the resistors $12_0$ to $12_{16}$ are selected such that the voltages at the upper ends thereof constitute a series of equally stepped reference voltages corresponding to the increments into which the analog input signal $V_{in}$ is to be digitized. Thus, all of the comparators $14_0$ to $14_{15}$ whose reference voltages are higher than the input voltage $V_{in}$ will produce low outputs, whereas all of the comparators whose reference voltages are lower than the input voltage $V_{in}$ will produce high outputs.

Although not explicitly illustrated, the circuit 10 further comprises a multiplexer or encoder that is responsive to the transition point from low to high output voltage from the comparators $14_0$ to $14_{15}$, and encodes the transition point to produce a digital value.

A major drawback of the conventional comparator 10 is that each of the comparators $14_0$ to $14_{15}$ operates at a different common mode voltage, which in the case of the circuit 10 of FIG. 1 is defined to be a voltage that is halfway between the voltages at the inverting and non-inverting inputs of the comparators $14_0$ to $14_{15}$.

Assuming, for example, that the input voltage $V_{in}$ can have a 2 V range from 1 V to 3 V, the reference voltage applied to inverting input of the lowest comparator $14_0$ will be approximately 1 V whereas the reference voltage applied to the highest comparator $14_{15}$ will be 3 V. If the input voltage $V_{in}$ has an average value of 2 V, the common mode voltage of the comparator $14_0$ is 2 V–1 V=1 V, whereas the common mode voltage of the comparator $14_{15}$ is 3 V–1 V=2 V.

In general, depending on the value of the input signal $V_{in}$, the common mode voltage of the comparators $14_0$ to $14_{15}$ can range from 0 V to 3 V, the entire range of the input signal $V_{in}$. Thus, the comparators $14_0$ to $14_{15}$ must be designed with sufficient dynamic range to accommodate this magnitude of input signal variation.

Each of the reference voltages can be considered as a "threshold" voltage for the particular comparator to which it is connected and is different for each comparator in the bank. Since a practical comparator is implemented as a differential amplifier (emitter-coupled in a bipolar transistor circuit or source-coupled in a field-effect transistor circuit), the input common-mode voltage can have a strong effect on the input-output transfer and delay characteristics.

These common-mode induced differences can cause an effective decrease in the overall resolution of the comparator bank. In addition, high frequency white noise due to crosstalk can become superimposed onto the input line resulting in further limits on the achievable resolution.

SUMMARY OF THE INVENTION

A differential comparator circuit for an Analog-to-Digital Converter (ADC) or other application in accordance with the present invention includes a plurality of differential comparators and a plurality of offset voltage generators.

Each comparator includes first and second differentially connected transistor pairs having equal and opposite voltage offsets. First and second offset control transistors are connected in series with the transistor pairs respectively.

The offset voltage generators generate offset voltages corresponding to reference voltages which are compared with a differential input voltage by the comparators. Each offset voltage is applied to the offset control transistors of at least one comparator to set the overall voltage offset of the comparator to a value corresponding to the respective reference voltage.

The number of offset voltage generators required in an ADC application can be reduced by a factor or approximately two by applying the offset voltage from each offset voltage generator to two comparators with opposite logical sense such that positive and negative offset voltages are produced by each offset voltage generator.

The present comparator circuit eliminates the input terminal that is dedicated to creating a threshold voltage which is present in conventional comparators, and enables all comparators within a comparator bank to be driven differentially and operated at the same common mode voltage. This eliminates variations in transfer and delay characteristics between the individual comparators, and enables the resolution of the comparator circuit to be substantially increased over the prior art.

In addition, the dynamic range required by each comparator is reduced by a factor of two, resulting in increased linearity. Another advantage of the present invention is that high speed crosstalk noise is rejected since the differential inputs of each comparator carry the same noise.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 2:
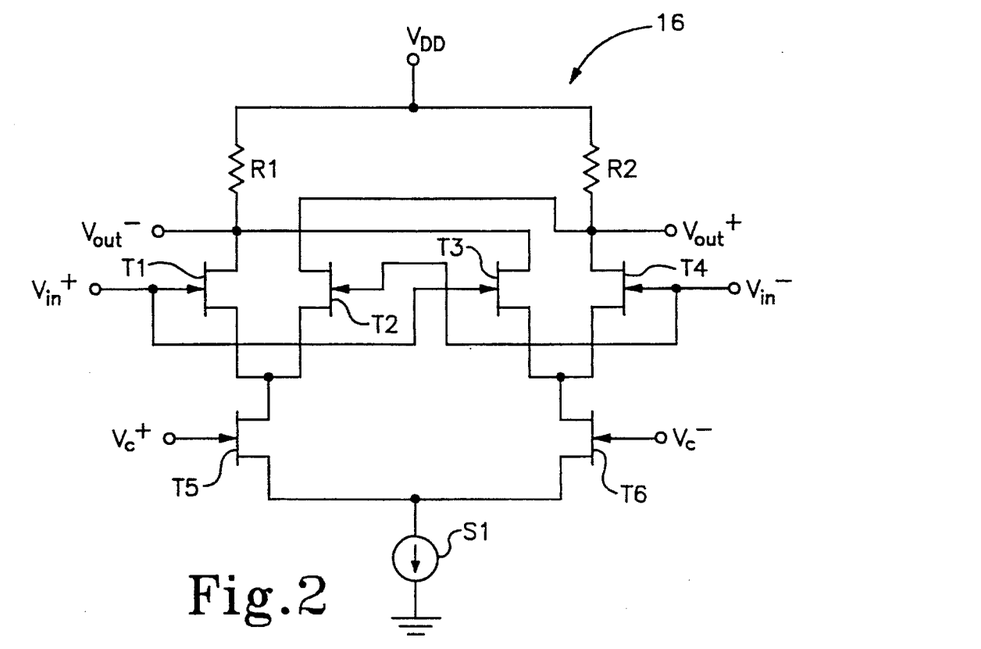
FIG. 2 is an electrical schematic diagram illustrating a thresholdless differential comparator embodying the present invention.

A comparator circuit according to the present invention comprises at least one thresholdless differential comparator 16 as illustrated in FIG. 2. The comparator 16 comprises a first differentially connected pair of transistors T1 and T2, and a second differentially connected pair of transistors T3 and T4. Although the comparator 16 is illustrated as being implemented using field-effect transistors, the invention is not so limited, and may be implemented using bipolar transistors or any other suitable type of electronic devices although not explicitly illustrated.

The sources of the transistors T1 and T2 are connected to the drain of an offset control transistor T5, whereas the sources of the transistors T3 and T4 are connected to the drain of an offset control transistor T6. The sources of the transistors T5 and T6 are connected through a constant current drain S1 to ground.

The drains of the transistors T1 and T2 are connected through load resistors R1 and R2 respectively to a power supply voltage $V_{DD}$. The drains of the transistors T3 and T4 are connected to the voltage $V_{DD}$ through the resistors R1 and R2 in parallel with the transistors T1 and T2.

A differential input voltage $V_{in}+-V_{in}-$ is applied to the gates of the transistors T1,T2, and also to the gates of the transistors T3,T4. A differential output voltage $V_{out}+-V_{out}-$ appears across the lower ends of the resistors R2 and R1 respectively. A differential offset voltage $V_c+-V_c-$ is applied to the gates of the transistors T5,T6.

In accordance with the present invention, the first pair of transistors T1 and T2 has a voltage offset that is equal and opposite to that of the pair of transistors T3 and T4. This can be accomplished by, for example, by appropriately scaling the gate widths of the transistors. The voltage offsets are also symmetrical about a zero point, such that when the input voltage $V_{in}+-V_{in}-$ and the offset voltage $V_c+-V_c-$ are zero, the output voltage $V_{out}+-V_{out}-$ is zero.

For the purpose of describing the principles of the invention, it will be assumed that the gate widths of the transistors T1 and T4 are equal, and are larger than the gate widths of the transistors T2 and T3 which are also equal. FIG. 5 illustrates an extreme case in which $V_c-$ is sufficiently small that the transistor T6 is turned off and no current flows through it and the transistors T3 and T4, but $V_c+$ is sufficiently large that current flows through the transistors T5, T1 and T2. FIG. 6 illustrates the opposite case in which the transistors T6, T3 and T4 are turned on and the transistors T5, T1 and T2 are turned off.

In FIG. 5, the circuit 16 effectively consists of only the transistors T1, T2 and T5 and the associated elements as illustrated. It will be further assumed that the input voltage $V_{in}+-V_{in}-$ is zero. Since the gate width of the transistor T1 is larger than that of the transistor T2, more current flows through the transistor T1 than through the transistor T2, and the voltage drop across the resistor R1 is larger than the voltage drop across the resistor R2.

Thus, voltage at $V_{out}-$ will be lower that the voltage at $V_{out}+$, and the differential offset voltage $V_{out}+-V_{out}-$ will be positive thereby constituting the maximum voltage offset of the transistor pair T1,T2. A negative input voltage $V_{in}+-V_{in}-$ (input voltage offset) would have to be applied to the transistor pair T1, T2 to produce a zero output voltage.

FIG. 6 illustrates the voltage offset of the transistor pair T3,T4. It will again be assumed that the input voltage $V_{in}+-V_{in}-$ is zero. Since the gate width of the transistor T4 is larger than that of the transistor T3, more current flows through the transistor T4 than through the transistor T3, and the voltage drop across the resistor R2 is larger than the voltage drop across the resistor R1.

Thus, voltage at $V_{out}+$ will be lower that the voltage at $V_{out}-$, and the differential offset voltage $V_{out}+-V_{out}-$ will be negative thereby constituting the maximum voltage offset of the transistor pair T3,T4. A positive input voltage $V_{in}+-V_{in}-$ (input voltage offset) would have to be applied to the transistor pair T3,T4 to produce a zero output voltage.

The voltage offset of the comparator 16, designated as $V_{off}$, is approximately equal to the algebraic sum of the voltage offsets of the transistor pairs T1,T2 and T3,T4, and is variable from a maximum positive value as described with reference to FIG. 5 to a maximum negative value as described with reference to FIG. 6 by selecting the value of the differential offset voltage $V_c+-V_c-$.

When $V_c+-V_c-$ has a maximum positive value, the comparator 16 has a maximum positive voltage offset $V_{off}$. When $V_c+-V_c-$ has a maximum negative value, the comparator has a maximum negative voltage offset $V_{off}$. When $V_c+-V_c-$ is zero, the voltage offsets of the transistor pairs T1,T2 and T3,T4 cancel each other out, and the voltage offset $V_{off}$ of the comparator 16 is zero. The voltage offset $V_{off}$ is continuously variable from the maximum positive value to the maximum negative value by selecting the value of the offset voltage $V_c+-V_c-$.

Figure 7:
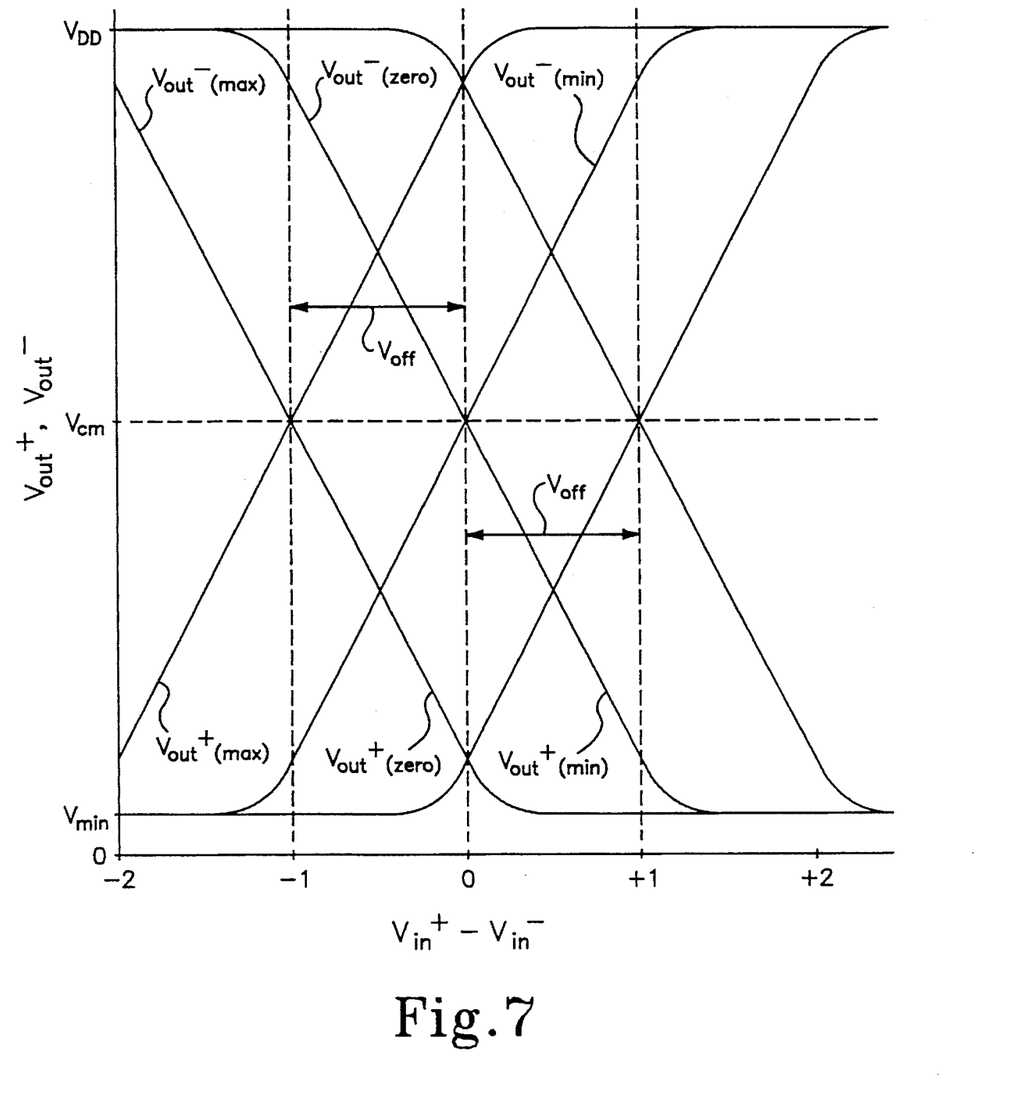
FIG. 7 is a graph which further illustrates the operation of the comparator in conjunction with FIGS. 5 and 6.

FIG. 7 illustrates how the output voltage $V_{out}+-V_{out}-$ varies as a function of input voltage $V_{in}+-V_{in}-$ for different values of offset voltage $V_c+-V_c-$. $V_{off}$ is a generally, but not completely, linear function of $V_c+-V_c-$. The transfer function of output voltage with respect to input voltage is $(V_{out}+-V_{out}-)=(V_{in}+-V_{in}-)=V_{off}$.

When $V_c+-V_c-$ has a maximum positive value, $V_{off}$ is positive as described above, and a negative value of $V_{in}+-V_{in}-$ is required to produce a zero output voltage $V_{out}+-V_{out}-$. This case is represented in FIG. 7 by curves $V_{out}+$ (max) and $V_{out}-$(max). When $V_c+-V_c-$ has a maximum negative value, $V_{off}$ is negative, and a positive value of $V_{in}+-V_{in}-$ is required to produce a zero output voltage $V_{out}+-V_{out}-$. This case is represented in FIG. 7 by curves $V_{out}+$(min) and $V_{out}-$(min). When $V_c+-V_c-$ is zero, the voltage offset $V_{off}$ is zero as represented by curves $V_{out}+$ (zero) and $V_{out}-$(zero).

The magnitude of $V_{off}$ is selected to be at least equal to the maximum magnitude of a reference voltage with which the comparator 16 is to compare the input voltage $V_{in}+-V_{in}-$. For example, if the reference voltage can vary by 1 V above and below an average value (a comparison range of 2 V), then $V_{off}$ is equal to or greater than 1 V as illustrated.

In accordance with an important feature of the present invention, the comparator 16 provides a common mode voltage $V_{cm}$ that is constant over the entire operating range of input, output and offset voltages, In this case, the common mode voltage $V_{cm}$ is defined as the voltage at which $V_{out+}$ and $V_{out-}$ are equal. The voltage $V_{cm}$ is preferably at the middle of the voltage output range of the comparator 16 between $V_{DD}$ and a minimum value $V_{min}$, but may vary somewhat in actual practice.

Since the common mode voltage $V_{cm}$ is constant, the comparator 16 is immune to variations in input-output transfer and delay characteristics as descried above with reference to the prior art. The comparator 16 is therefore "thresholdless" as compared with the conventional comparator illustrated in FIG. 1.

Another important advantage of the present invention is that, due to the differential configuration, the required input voltage variation at each of the inputs $V_{in}+$ and $V_{in}-$ is one-half that required by a conventional comparator. For example, a 2 V input voltage range can be produced by symmetrically varying $V_{in}+$ from 3 V to 2 V (a 1 V range) and $V_{in}-$ from 2 V to 3 V. Where $V_{in}+=3$ V and $V_{in}-=2$ V, $V_{in+}-V_{in-}=3$ V−2 V=1 V. Where $V_{in}+=2$ V and $V_{in}-=3$ V, $V_{in+}-V_{in-}=2$ V=3 V=−1 V.

This eases the "headspace" requirements of the comparator 16 and enables increased linearity. In addition, high speed crosstalk noise is rejected since the differential inputs of each comparator carry the same noise.

Although it is within the scope of the invention to generate offset voltages $V_c+-V_c-$ corresponding to reference voltages for the comparators 16 of an ADC using resistors as illustrated in FIG. 1, this is not the preferred embodiment of the invention since the offset control transistors T5 and T6 are sources of non-linearity and clamping distortion that can reduce the resolution of the ADC.

Figure 3:
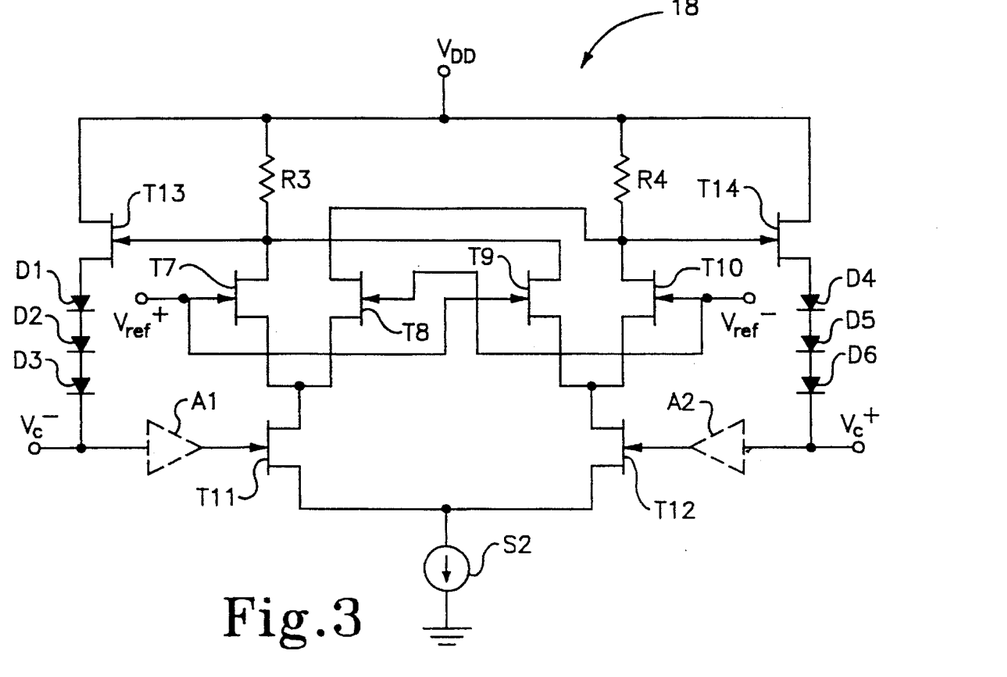
FIG. 3 is an electrical schematic diagram illustrating an offset voltage generator for generating and applying an offset voltage to the comparator of FIG. 2.

For this reason, offset voltage generators 18 as illustrated in FIG. 3 are provided to generate offset voltages $V_c+-V_c-$ in response to differential reference voltages $V_{ref}+-V_{ref}-$.

A reference voltage generator 18 as viewed in FIG. 3 comprises a comparator which is essentially similar to the comparator 16, including a first pair of differentially connected transistors T7 and T8, a second pair of differentially connected transistors T9 and T10, a first offset control transistor T11, a second offset control transistor T12, load resistors R3 and R4 and a constant current drain S2 that are identical to the elements in corresponding positions in the comparator 16.

The generator 18 further comprises a transistor T13 that is connected between the voltage supply $V_{DD}$ and the gate of the transistor T11 through voltage dropping diodes D1, D2 and D3, and a transistor T14 that is connected between the voltage supply $V_{DD}$ and the gate of the transistor T12 through voltage dropping diodes D4, D5 and D6. The gates of the transistors T13 and T14 are connected to the lower ends of the resistors R3 and R4 respectively.

The reference voltage $V_{ref}+-V_{ref}-$ is applied to the gates of the transistors T7 and T10, whereas the offset voltage $V_c+-V_c-$ appears across the cathodes of the diodes D3 and D6. If desired, optional amplifiers A1 and A2 can be inserted as illustrated to increase the linearity of the generator 18 by providing extremely high gain.

The offset voltage $V_c+-V_c-$ is generated at the lower ends of the resistors R3 and R4, and is fed back to the gates of the transistors T11 and T12 to provide a closed feedback loop. The transistors T11 and T12 create gain and non-linearity that is equal and opposite to that created by the transistors T5 and T6 of the comparator 16, such that these undesirable effects are canceled out and the reference voltage $V_{ref}+-V_{ref}-$ is applied to the comparator 16 in a substantially linear manner.

The operation of the comparator 16 in combination with the generator 18 will be described with reference being made to the simplified equivalent circuits of FIGS. 8 and 9 respectively.

Figure 8:
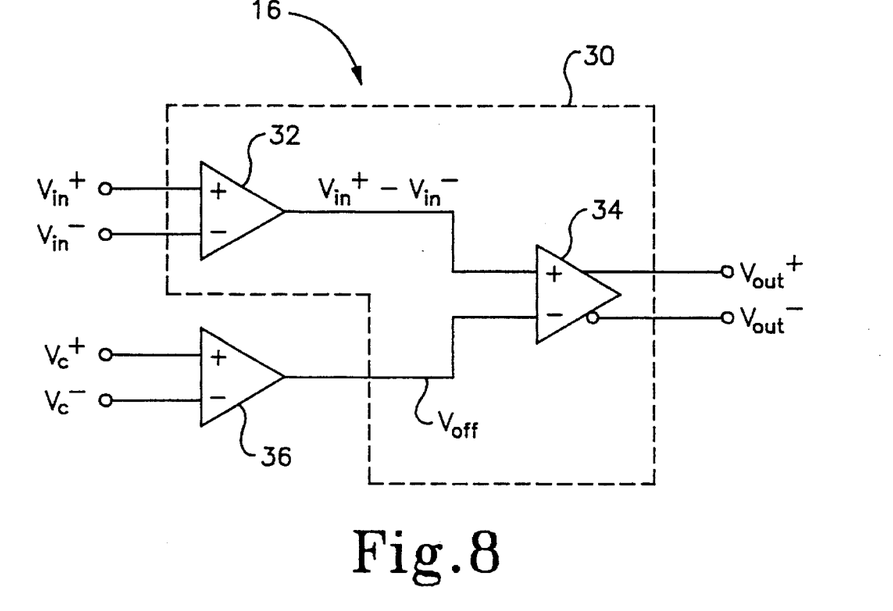
FIG. 8 is a simplified equivalent circuit diagram of the comparator.
Figure 9:
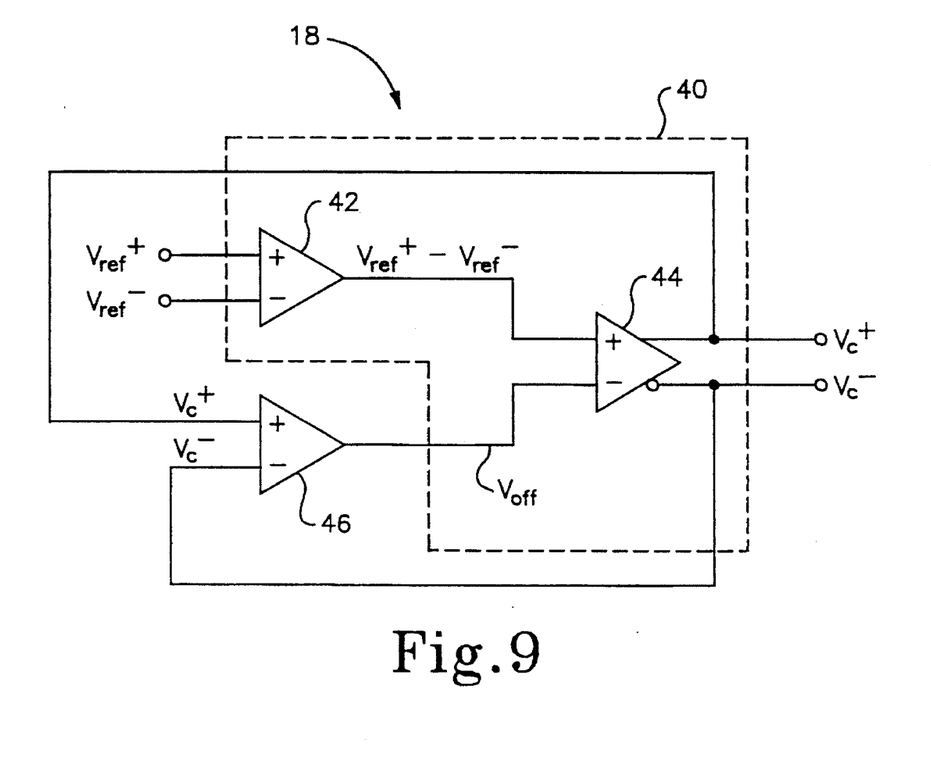
FIG. 9 is a simplified equivalent circuit diagram of the offset voltage generator.

The transistors T1, T2, T3 and T4 in FIG. 8 are represented by a block 30, which has an amplification factor or gain of $A_{vs}$. The block 30 comprises an operational amplifier 32 that produces the differential input signal $V_{in+}-V_{in-}$, and an operational amplifier 34 that receives $V_{in+}-V_{in-}$ at its non-inverting input.

The transistor T5 and T6 are represented by an amplifier 32 having a gain of $A_{off}$, which produces the offset voltage $V_{off}$ at its output such that $V_{off}=(V_c+-V_c-)\times A_{off}$, which is applied to the inverting input of the amplifier 34. The output voltage $V_{out+}-V_{out-}$ appears at the output of the amplifier 34.

The generator 18 comprises a block 40 including amplifiers 42 and 44 that are essentially similar to the elements 30, 32 and 34, and an amplifier 46 that is similar to the amplifier 46. The amplifier 42 produces the differential input signal $V_{ref+}-V_{ref-}$ which is applied to the non-inverting of the amplifier 44. The offset voltage $V_c+-V_c-$ appears at the output of the amplifier 44, and is fed back to the input of the amplifier which produces the offset signal $V_{off}$ as being equal to $V_{off}=(V_c+-V_c-)\times A_{off}$.

The transfer function of the generator 18 can be approximate by $$V_{off} \approx A_{off}(V_c+ - V_c-) \approx \frac{2A_{vs}A_{off}}{1 + 2A_{vs}A_{off}} (V_{ref+} - V_{ref-})$$

In the limiting case in which $A_{vs}$ and $A_{off}$ are very large, which is desirable in the context of the present invention, $$V_{off} \approx V_{ref+} - V_{ref-}$$

The feedback loop in the generator 18 produces the offset voltage $V_c+-V_c-$ as being substantially equal to the reference voltage $V_{ref+}-V_{ref-}=V_{off}$ divided by the gain $A_{off}$ of the amplifier 46. The amplifier 36 in the comparator 16 multiplies $V_c+-V_c-$ by the gain $A_{off}$ such that the output of the amplifier 36 is $V_{off}\approx V_{ref+}-V_{ref-}$. Since the amplifiers 36 and 46 are identical, division of the reference voltage by the amplifier 46 cancels multiplication of the reference voltage by the amplifier 46, such that all non-linear and other distortion is also canceled out. In this manner, the comparator 16 and generator 18 in combination can produce reference voltages with high linearity and resolution.

Figure 4:
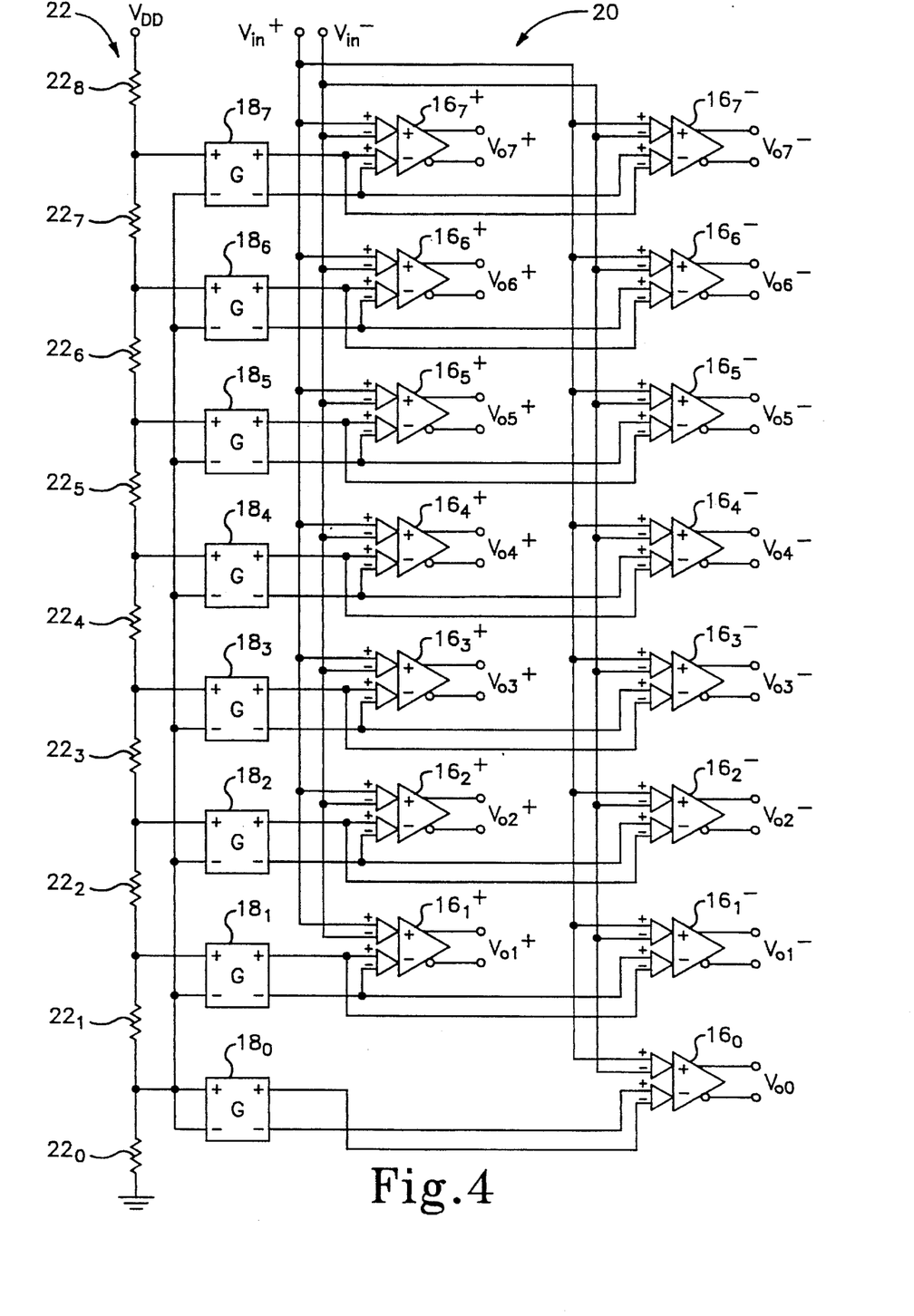
FIG. 4 is an electrical schematic diagram illustrating a 4-bit thresholdless differential comparator circuit for an ADC comprising pluralities of the comparators of FIG. 2 and the offset voltage generators of FIG. 3.

FIG. 4 illustrates a 4-bit comparator circuit 20 for an ADC or other application, comprising a resistor voltage divider 22 including resistors $22_0$ to $22_8$ connected in series between $V_{DD}$ and ground. The circuit 20 further comprises offset voltage generators $18_0$ to $18_7$ as illustrated in FIG. 3, and comparators $16_7-$ to $16_7+$ as illustrated in FIG. 2 that produce differential output voltages $V_{o7}-$ to $V_{o7}+$.

The differential nature of the present invention enables the comparator circuit 20 to be embodied using approximately one-half the number of generators 18 as would be required in a prior art configuration. This is accomplished by using a single offset voltage generator to apply a positive offset to one comparator 16 and a negative offset to another comparator 16.

The circuit 20 comprises $2^N-1=2^4-1=15$ comparators 16, and $2^N-2^{N-1}=2^4-2^3=8$ generators 18. Since the generator $18_0$ generates a zero reference voltage, it could be replaced by a direct connection to ground in which case the number of generators 18 would be $2^N-2^{N-1}-1=7$ generators 18.

The $V_{ref^-}$ inputs of all of the generators $18_0$ to $18_7$, as well as the $V_{ref^-}$ terminal of the generator $18_0$, are all connected to the upper end of the resistor $22_0$. The $V_{ref^+}$ inputs of the generators $18_1$ to $18_7$ are connected to the upper ends of the resistors $22_1$ to $22_8$ respectively, such that progressively larger voltages are applied to these inputs. The values of the resistors $22_0$ to $22_8$ are selected such that $V_{ref^+}$ voltages increase in equal increments, and the input voltage range is equally divided into 16 steps.

The offset voltages $V_c+-V_c-$ from the generators $18_1$ to $18_7$ are applied to the offset voltage inputs of the comparators $16_1+$ to $16_7+$ without reversal of logical sense such that the offset voltages increase in a positive direction. The offset voltages $V_c+-V_c-$ from the generators $18_1$ to $18_7$ are applied to the offset voltage inputs of the comparators $16_1-$ to $16_7-$, with opposite (reversed) logical sense such that the offset voltages increase in a negative direction. This is accomplished by merely reversing the connections of the offset voltages $V_c+-V_c-$ to the comparators $16_1-$ to $16_7-$ relative to the connections to the comparators $16_1+$ to $16_7+$. The comparator $16_0$ receives a zero offset voltage.

In this manner, the comparators $16_7-$ to $16^7+$ receive offset voltages $V_c+-V_c-$ that cover the entire range of the input signal to be digitized. If the input voltage $V_{in+}-V_{in-}$ is smaller than the reference voltage $V_{ref+}-V_{ref-}$ as represented by the respective offset voltage $V_c+-V_c-$, a comparator will produce a negative output voltage $V_{out+}-V_{out-}$, and vice-versa.

EXAMPLE

Figure 10:
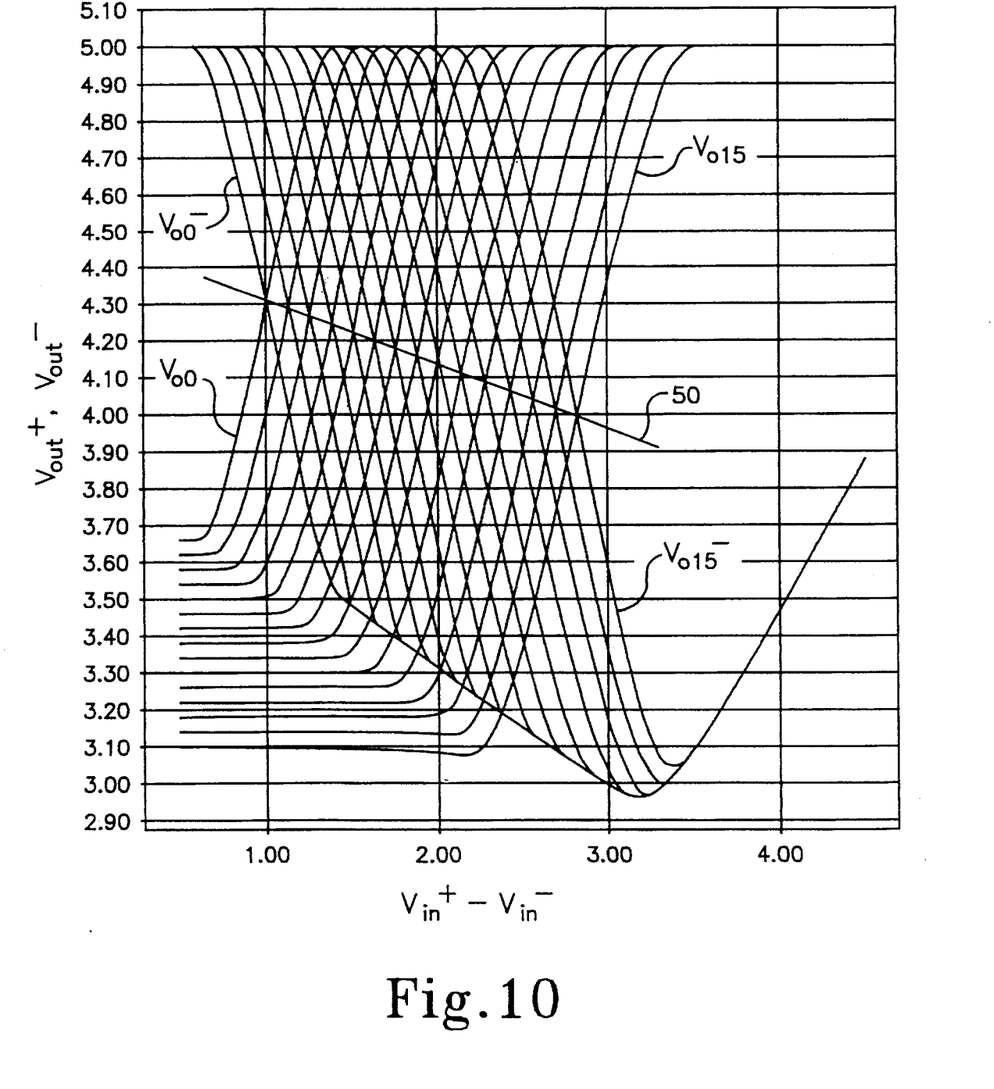
FIG. 10 is a graph illustrating a computer simulation of the operation of the prior art comparator circuit of FIG. 1.
Figure 11:
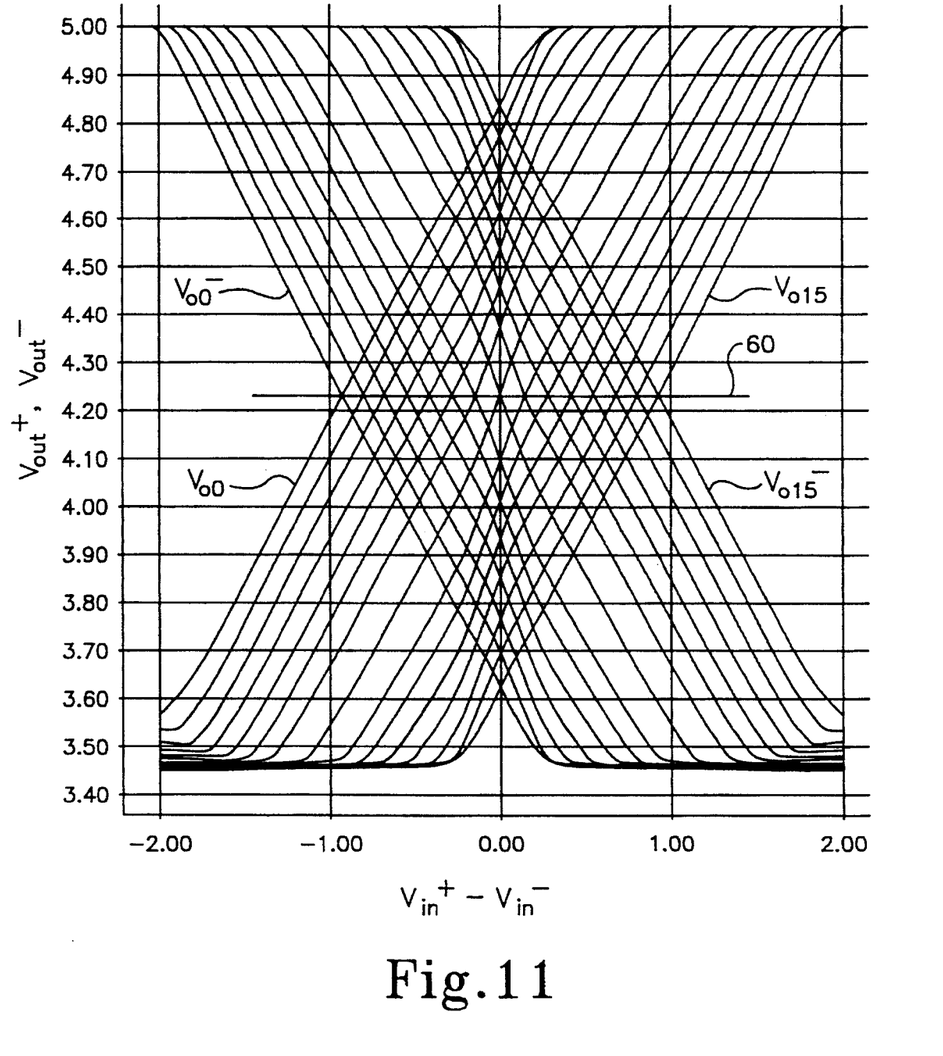
FIG. 11 is a graph illustrating a computer simulation of the operation of the present comparator circuit of FIG. 4.

FIGS. 10 and 11 illustrate a comparison of the prior art comparator circuit 10 of FIG. 1 with the present comparator circuit 20 of FIG. 4. The figures were generated by computer simulation using the SPICE analysis program.

In both cases, the power supply voltage $V_{DD}=5$ V, the analog input signal had a voltage range of 2 V, the resolution was 4 bits (16 increments).

FIG. 10 illustrates the prior art arrangement, in which the input signal range was 1 V to 3 V. The resistors $12_0$ to $12_{16}$ had the following values:
$12_0=10k\Omega$ $12_1=1,250\Omega$ $12_2=1,250\Omega$ $12_3=1,250\Omega$ $12_4=1,250\Omega$ $12_5=1,250\Omega$ $12_6=1,250\Omega$ $12_7=1,250\Omega$ $12_8=1,250\Omega$ $12_9=1,250\Omega$ $12_{10}=1,250\Omega$ $12_{11}=1,250\Omega$ $12_{12}=1,250\Omega$ $12_{13}=1,250\Omega$ $12_{14}=1,250\Omega$ $12_{15}=1,250\Omega$ $12_{16}=20k\Omega$
such that the voltages at the upper ends of the resistors $12_0$ to $12_{14}$ had respective values of:
V0=1.0256 V V1=1.1538 V V2=1.2821 V V3=1.4103 V V4=1.5385 V V5=1.6667 V V6=1.7949 V V7=1.9231 V V8=2.0513 V V9=2.1795 V V10=2.3077 V V11=2.4359 V V12=2.5641 V V13=2.6923 V V14=2.8205 V The input voltage range was $V_{in}<1.0256$ for the lowest increment (all comparator outputs low) to $V_{in}>2,8205$ V (all comparator outputs high).

The comparators $14_0$ to $14_{15}$ of FIG. 1 are generally implemented as differential amplifiers as described above, but with no voltage offsets. FIG. 10 illustrates the transfer characteristic for each of the comparators $14_0$ to $14_{15}$, including the illustrated outputs $V_{o0}$ to $V_{o15}$ and the corresponding complementary differential outputs $V_{o0}-$ to $V_{o15}-$.

The graph of FIG. 10 exhibits severe distortion which is caused by two separate effects.

1. Variation in the peak-to-peak voltage and common mode voltage of the individual comparators. The common mode voltage is designated by a line 50 which has a large downward slope.

2. Clamping of the comparator outputs when the input voltages have values that cause the output voltages to saturate or turn off the individual transistors in the comparators.

The operation of the present comparator 20 is illustrated in FIG. 11. In this exemplary case, the resistors $22_0$ to $22_8$ had the values:
$22_0$32 $20k\Omega$ $22_1=1328.6\Omega$ $22_2=1428.6\Omega$ $22_3=1428.6\Omega$ $22_4=1428.6\Omega$ $22_5=1428.6\Omega$ $22_6=1428.6\Omega$ $22_7=1428.6\Omega$ $22_8=20k\Omega$
such that the voltages at the upper ends of the resistors $22_1$ to $22_8$ had the respective values:
V0=2.000 V V1=2.143 V V2=2.286 V V3=2.429 V V4=2.571 V V5=2.714 V V6=2.857 V V7=3.000 V The output voltages of the comparators $16_7-$ to $16_7+$ are designated as $V_{o0}$ to $V_{o15}$ and $V_{o0}-$ to $V_{o15}-$ to enable direct comparison with the prior art example of FIG. 10. The common mode input voltage was selected to be 2.5 V, halfway between the power supply voltages (5 V and ground). The common mode input voltage was approximately 4.2 V as indicated by a line 60 which is substantially horizontal, indicating that the common mode voltage remains constant over the entire operating range of the comparator circuit 20.

In summary, it will be sen that the present voltage comparator circuit eliminates the input terminal that is dedicated to creating a threshold voltage which is present in conventional comparators, and enable all comparators within a comparator bank to be driven differentially and operated at the same common mode voltage. This eliminates variations in transfer and delay characteristics between the individual comparators, and enables the resolution of the comparator circuit to be substantially increased over the prior art.

In addition, the dynamic range required by each comparator is reduced by a factor of two, resulting in increased linearity. Another advantage of the present invention is that high speed crosstalk noise is rejected since the differential inputs of each comparator carry the same noise.

Various modifications will become possible for those skilled in the art after receiving the teachings of the present disclosure without departing from the scope thereof.

I claim:

1. A voltage comparator circuit comprising:

a reference voltage generator for generating a plurality of progressively larger differential reference voltages; and a plurality of differential comparators for comparing a differential input voltage with said reference voltages and producing differential output voltages having first logical senses if said input voltage is larger than said reference voltages, and having second logical senses if said input voltage is smaller than said reference voltages respectively, in which:

each comparator has an offset voltage input; and the circuit further comprises a plurality of differential offset voltage generators for generating and applying offset voltages having values corresponding to said reference voltages to said offset voltage inputs of the comparators in a predetermined arrangement;

the comparators having comparator voltage offsets that vary in accordance with said offset voltages respectively.

2. A circuit as in claim 1, in which each comparator comprises:

a differentially connected first transistor pair having differential first inputs for receiving said input voltage and differential first outputs at which said output voltage appears;

a differentially connected second transistor pair having differential second inputs for receiving said input voltage and differential second outputs that are connected in parallel with said first outputs;

a first offset control transistor which is connected in series with the first transistor pair and has a single-ended first offset input; and a second offset control transistor which is connected in series with the second transistor pair and has a single-ended second offset input; in which the first and second transistor pairs have first and second voltage offsets of opposite logical sense respectively; and said offset voltage is applied across said first and second offset inputs.

3. A circuit as in claim 2, in which said first and second voltage offsets are symmetrical, and said comparator voltage offset is zero when said offset voltage is zero.

4. A circuit as in claim 3, in which the first and second voltage offsets are at least as large as a maximum value of said reference voltage.

5. A circuit as in claim 2, in which each offset voltage generator comprises:

a differentially connected third transistor pair having third differential inputs for receiving said reference voltage and third differential outputs at which said offset voltage appears;

a differentially connected fourth transistor pair having differential fourth inputs for receiving said reference voltage and differential fourth outputs that are connected in parallel with said third outputs;

a third offset control transistor which is connected in series with the third transistor pair and has a single-ended third offset input; and a fourth offset control transistor which is connected in series with the second transistor pair and has a single-ended fourth offset input;

the third and fourth transistor pairs having third and fourth voltage offsets of opposite logical sense respectively; and said offset voltage is fed back from said third outputs across said third and fourth offset inputs respectively.

6. A circuit as in claim 5, in which said third and fourth voltage offsets are substantially equal to said first and second voltage offsets respectively.

7. A circuit as in claim 6, in which:

the third and fourth transistor pairs are substantially identical to the first and second transistor pairs respectively; and the third and fourth offset control transistors are substantially identical to the first and second offset control transistors respectively.

8. A circuit as in claim 1, in which:

each offset voltage generator applies its offset voltage to said offset voltage input of one of the comparators with a first logical sense and to said offset voltage input of another of the comparators with a second logical sense.

9. A circuit as in claim 8, in which the circuit is an N-bit comparator circuit, comprising:

$2^N-1$ comparators; and $2^N-2^{N-1}-1$ differential offset voltage generators.

10. A circuit as in claim 9, further comprising means for applying a zero offset voltage to one of the comparators.

11. A circuit as in claim 10, in which said means comprises a differential offset voltage generator.

12. A circuit as in claim 1, in which:

the circuit comprises power supply inputs for receiving a power supply voltage thereacross; and said input voltage has a common mode voltage that is substantially equal to one-half said power supply voltage.

13. A differential voltage comparator circuit for comparing a differential input voltage with a differential reference voltage and producing a differential output voltage a having first logical sense if said input voltage is larger than said reference voltage, and having second logical sense if said input voltage is smaller than said reference voltage, comprising:

a differentially connected first transistor pair having differential first inputs for receiving said input voltage and differential first outputs at which said output voltage appears;

a differentially connected second transistor pair having differential second inputs for receiving said input voltage and differential second outputs that are connected in parallel with said first outputs;

a first offset control transistor which is connected in series with the first transistor pair and has a single-ended first offset input; and a second offset control transistor which is connected in series with the second transistor pair and has a single-ended second offset input; in which the first and second transistor pairs have first and second voltage offsets of opposite logical sense; and the first and second offset inputs are adapted to have an offset voltage corresponding to said reference voltage applied thereacross.

14. A circuit as in claim 13, in which:

said first and second voltage offsets are symmetrical; and the comparator has a zero voltage offset when said offset voltage is zero.

15. A circuit as in claim 14, in which the first and second voltage offsets are at least as large as a maximum value of said reference voltage.

16. A circuit as in claim 13, further comprising an offset voltage generator that includes:

a differentially connected third transistor pair having third differential inputs for receiving said reference voltage and third differential outputs at which said offset voltage appears;

a differentially connected fourth transistor pair having differential fourth inputs for receiving said reference voltage and differential fourth outputs that are connected in parallel with said third outputs;

a third offset control transistor which is connected in series with the third transistor pair and has a single-ended third offset input; and a fourth offset control transistor which is connected in series with the second transistor pair and has a single-ended fourth offset input;

the third and fourth transistor pairs having third and fourth voltage offsets of opposite logical sense respectively; and said offset voltage is fed back from said third outputs across said third and fourth offset inputs respectively.

17. A circuit as in claim 16, in which said third and fourth voltage offsets are substantially equal to said first and second voltage offsets respectively.

18. A circuit as in claim 17, in which:

the third and fourth transistor pairs are substantially identical to the first and second transistor pairs respectively; and the third and fourth offset control transistors are substantially identical to the first and second offset control transistors respectively.

19. A circuit as in claim 15, in which:

the circuit comprises power supply inputs for receiving a power supply voltage therebetween; and said input voltage has a common mode voltage that is substantially equal to one-half said power supply voltage.

* * * * *